(12) United States Patent
Winkler et al.

(10) Patent No.: US 6,605,312 B2
(45) Date of Patent: Aug. 12, 2003

(54) METHOD OF PRODUCING A THIN-FILM SYSTEM

(75) Inventors: Torsten Winkler, Radeberg (DE); Ralf Blüthner, Radebeul (DE); Klaus Goedicke, Dresden (DE); Michael Junghähnel, Dresden (DE); Hans Buchberger, Kronberg (DE); Manfred Müller, Essenheim (DE); Arno Hebgen, Mendt/Dahlen (DE); Hans-Hermann Schneider, Heidesheim (DE)

(73) Assignees: Fraunhofer-Gesellschaftt zur Forderung der Angewandten Forschung e.V., Munich (DE); International Business Machines Corporation, New York, NY (US)

( * ) Notice: Subject to any disclaimer, the term of this patent is extended or adjusted under 35 U.S.C. 154(b) by 0 days.

(21) Appl. No.: 09/962,212

(22) Filed: Sep. 26, 2001

(65) Prior Publication Data
US 2002/0063053 A1 May 30, 2002

(30) Foreign Application Priority Data

Oct. 18, 2000 (DE) .......................... 100 51 509

(51) Int. Cl.[7] .............................. B05D 1/00; H05H 1/24; C23C 8/00; C23C 14/34
(52) U.S. Cl. .............................. 427/9; 427/8; 427/569; 427/585; 204/192.1; 204/192.13
(58) Field of Search ......................... 204/192.1, 298.08, 204/298.06, 192.12, 192.13; 427/8, 9, 569, 585

(56) References Cited

U.S. PATENT DOCUMENTS

| | | | |
|---|---|---|---|
| 4,462,883 A | 7/1984 | Hart | 204/192 C |
| 5,846,648 A | 12/1998 | Chen et al. | 428/332 |
| 5,922,442 A | 7/1999 | Lal et al. | 428/216 |
| 6,019,876 A | 2/2000 | Goedicke et al. | 204/192.2 |
| 6,150,015 A | 11/2000 | Bertero et al. | 428/332 |
| 6,413,382 B1 * | 7/2002 | Wang et al. | 204/192.12 |

FOREIGN PATENT DOCUMENTS

| | | | |
|---|---|---|---|
| DE | 19855454 | 6/1999 | G11B/5/64 |
| DE | 19851062 | 6/2000 | C23C/14/35 |
| EP | 0104870 | 4/1984 | C03C/17/36 |
| EP | 0999291 | 5/2000 | C23C/14/16 |
| WO | 99/27151 | 6/1999 | C23C/14/34 |

OTHER PUBLICATIONS

English Language Abstract of DE 198 51 062.

Jie Zou et al., "CoCrTa Intermediate Layers on NiAl Underlayers for CoCrPt Longitudinal Thin Film Magnetic Media", IEEE Transactions on Magnetic, vol. 34, No. 4, pp. 1582–1584 (1998).

A. Klöppel et al., "Dependence of the Electrical and Optical Behaviour of ITO–silver–ITO Multilayers on the Silver Properties", Thin Solid Films, vol. 365, pp. 139–146 (2000).

* cited by examiner

Primary Examiner—Steven H. Ver Steeg
(74) Attorney, Agent, or Firm—Greenblum & Bernstein, P.L.C.

(57) ABSTRACT

Production of a thin-film system containing at least one ultra-thin film, preferentially in the film thickness range from 1 to 10 nm, which is deposited by plasma-aided chemical or physical vapor-phase deposition using magnetron discharges. The method is characterized in that in the course of deposition of the ultra-thin film the power output is introduced into the plasma in the form of a controlled number of power pulses and that the average power output during the pulse-on time is set higher by a factor of at least 3 than the averaged power output over the entire coating time during deposition of the ultra-thin film.

19 Claims, 1 Drawing Sheet

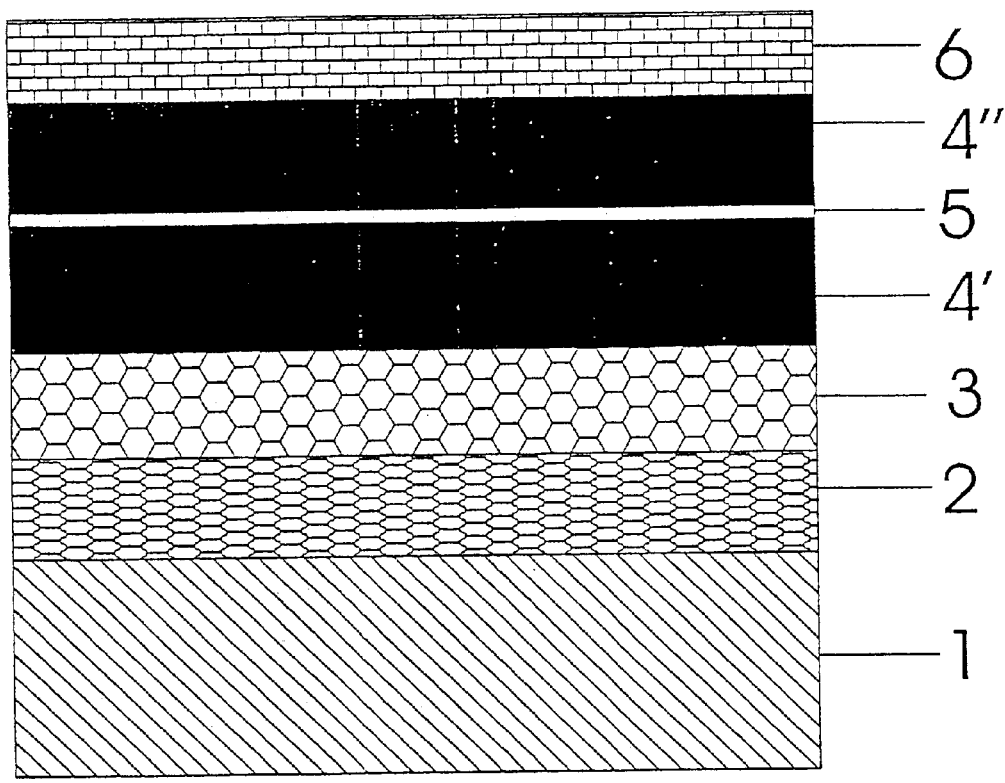

METHOD OF PRODUCING A THIN-FILM SYSTEM

CROSS-REFERENCE TO RELATED APPLICATIONS

The present application claims priority under 35 U.S.C. §119 of German Patent Application No. 100 51 509.6, filed Oct. 18, 2000, the disclosure of which is expressly incorporated by reference herein in its entirety.

BACKGROUND OF THE INVENTION

1. Field of the Invention

The present invention relates to a method of producing a thin-film system by plasma-aided chemical or physical vapor-phase deposition, containing at least one ultra-thin film. Such thin film systems are used in a wide variety of ways in technical applications, such as in the manufacture of magnetic and magneto-optical storage media, in the manufacture of cathode ray tubes and flat panel monitors with an electromagnetic radiation screen, and for high-performance optical and laser-optic beam splitters. However, these are non-limiting examples, and the invention is not restricted to these examples.

2. Discussion of Background Information

Numerous thin-film systems for optical, electrical and magnetic applications include ultra-thin films in the thickness range from 1 to 10 nm. These act as a barrier against solid or gas diffusion, as a nucleation film to influence the growth and crystal size of the subsequently applied film, and in many other ways. Since the properties of these ultra-thin films are usually also decisive in determining the properties of the overall film system, and indeed enable certain parameters to be met in the first place, high demands are frequently placed on such ultra-thin films. They relate to precise conformance to the specified film thickness and its homogeneity across the entire substrate, a high optical transparency in the case of optical functional film systems or a specific grain size and/or texture of film systems for magnetic or magneto-optical storage media, as well as a high degree of reproducibility of the properties cited.

Optical film systems with high transparency in the visible spectral range and high reflectance in the close infrared range are known, such as disclosed in EP 0 104 870 A1 and its U.S. family member U.S. Pat. No. 4,462,883, which are incorporated by reference herein in their entireties, which, in addition to tin oxide and silver films, also contain an ultra-thin copper film.

A method of producing low-resistance transparent electrodes from indium/tin oxide is also known, such as disclosed in A. Klöppel et al., Thin Solid Films 365 (2000) 139–146, which is incorporated by reference herein in it entirety, by which a substantial reduction in surface resistance can be achieved based on an ultra-thin silver film with enhanced electrical and optical properties.

Numerous proposals for increasing the recording density of magnetic hard disks are known, based on the introduction of multiple film systems with ultra-thin intermediate films and/or nucleation films, such as disclosed in U.S. Pat. Nos. 5,846,648, 5,922,442, and Jie Zou et al. IEEE Transactions on Magnetics, Vol. 34 No. 4 (1998), 1582–1584, each of which is incorporated by reference herein in its entirety. Such thin-film systems generally also contain much thicker functional films, which have to be produced in sequence with the ultra-thin films. The methods of depositing such multiple film systems are frequently implemented in so-called short-cycle vacuum charging plants, using plasma-CVD or plasma-PVD processes. A set time is allotted for the manufacture of each individual film in the film system, and the film deposition is effected with a stationary substrate. The shortest possible cycle time is produced from the thickness of the thickest film and the deposition rate at which it is deposited. The plasma-aided chemical vapor deposition (CVD) and physical vapor deposition (PVD) methods applied usually use magnetron discharges.

The extreme thinness of the film means it is necessary to select a short coating time and/or a very low deposition rate in plasma-aided deposition of the film. Very short coating times make precise setting of the film thickness more difficult. If the coating time is dictated by other process steps, the only remaining technique of obtaining ultra-thin films is to reduce the deposition rate. If the deposition rate is set by variation of the power output of a magnetron discharge, below a certain minimum power output dependent on the size of the magnetrons it is no longer possible to ensure the uniformity of the physical properties of the ultra-thin film referred to the area of the substrate. Furthermore, the low power density required in such a case for a low deposition rate means that in plasma-aided deposition of the film the reproducibility of the film properties is significantly lower than that of comparatively thicker films deposited at a higher deposition rate and plasma power density.

The reasons for the difficulties cited, which are detrimental to a number of different film properties, obviously lie in a time and space non-uniformity of the plasma during film deposition, which occurs at low power densities in the plasma in particular. This applies especially to deposition methods which use magnetron discharges, e.g., magnetron atomization.

DE 198 55 454 and its U.S. family member U.S. Pat. No. 6,150,015, which are incorporated by reference herein in their entireties, disclose a method of enclosing the space in which the film-forming particles are created with only reduced cross-section vapor outlet openings to the substrate, meaning that the flow of film-forming particles is restricted. In this way, a higher plasma density and a more uniform distribution of the plasma can be achieved at least in the environment in which the film-forming particles are created. Despite some improvements in the reproducibility of the film thickness, as well as the attained properties and the uniformity of the film, this method remains subject to a number of disadvantages.

In addition to the increased cost, the elements employed to restrict the particle flow also result in greater process uncertainty. The efficiency of the deposition method is very low, and some properties are still not attained to the desired extent. In particular, this method cannot be applied for stationary deposition where high demands are placed in terms of the quality and uniformity of the ultra-thin films.

SUMMARY OF THE INVENTION

The present invention relates to providing a method which enables production of thin-film systems containing ultra-thin single films, preferentially in the film thickness range from 1 to 10 nm, of which the structural properties represent an improvement to the state of the art, with greater uniformity over the entire coating range, and with enhanced reproducibility.

The present invention is directed to a process of producing a thin-film system containing at least one ultra-thin film, which is deposited by plasma chemical vapor deposition or plasma physical vapor deposition using magnetron discharges, comprising depositing the ultra-thin film by introducing power output into plasma of the plasma chemical vapor deposition or plasma physical vapor deposition in the form of a controlled number of power pulses, and the average power output per unit time during pulse-on time is higher by a factor of at least 3 as compared to a total power output over a total coating time during deposition of the ultra-thin film.

The at least one ultra-thin film can have a film thickness of from 1 to 10 nm.

The average power output per unit time during pulse-on time can be higher by a factor of at least 10, or a factor of at least 20, and even a factor of at least 30 or higher, as compared to a total power output over a total coating time during deposition of the ultra-thin film.

The power output can be fed periodically or aperiodically into the plasma in a form of power pulses.

The process can include introducing 100 to 10,000 power pulses to obtain an entire deposition of the ultra-thin film.

At least one of power density and pulse duration of the power pulses can be freely selectable.

The power density and pulse duration of the power pulses during deposition of the ultra-thin film can be kept constant.

During deposition of the ultra-thin film, the power pulses can be counted, the film thickness can be measured at least once after introduction of a specific number of power pulses, and a remaining number of power pulses required to attain the target film thickness can be calculated therefrom and pre-set.

The power output in each pulse can be essentially constant over time.

The power output in each pulse can rise over time.

The power output in each pulse can fall over time.

The present invention is also directed to magnetic film systems produced in accordance with the process of the invention.

BRIEF DESCRIPTION OF THE DRAWINGS

The present invention is further described in the detailed description which follows, in reference to the noted FIGURE of drawings by way of non-limiting example of exemplary embodiments of the present invention, wherein:

The FIGURE illustrates a magnetic film system produced using the method in accordance with the invention.

DETAILED DESCRIPTION OF THE PRESENT INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the figure of drawings making apparent to those skilled in the art how the several forms of the present invention may be embodied in practice.

In the present invention, the energy for the plasma-aided coating process is supplied in the form of discrete power pulses, wherein the power output during the individual pulses substantially exceeds the average value of the plasma over time over the entire coating time. In this manner, the condensation conditions in the creation of thin films are evidently substantially changed, and this is a fact which is of significance, in particular, in the deposition of ultra-thin films. Surprisingly, the film thickness at which a solid film forms is greatly reduced, presumably owing to improved formation of condensation nuclei.

The pulse-shaped energy supply also provides a good basis for monitoring of the film-forming process. The duration of a coating—that is, the time required to attain the specified film thickness—can be easily controlled if the necessary number of pulses until attainment of the respective film thickness is known. By choosing appropriate pulse pauses, the time until the specified film thickness is reached can be adjusted to the technologically dictated length of the process step.

The correlation between the film thickness and the number of pulses applied can be obtained, if a pulse counter is available, by a one-off thickness measurement or cyclically by a combination of pulse counting and an in-situ measurement method for the film thickness and for an advance calculation of the number of pulses still required to attain the specified film thickness, thereby permitting a particularly precise setting of the film thickness.

The deposition of the ultra-thin film itself is effected in accordance with the invention during the pulse-on time with a much increased plasma density, and thus with greater exposure of the condensing film to carriers and excited neutral particles. This results in a high level of surface mobility of the condensing particles, so that lateral motion of the condensing particles produces an altered growth pattern and thus an increase in the density of the film and an improvement in numerous film properties. If ultra-thin films with pronounced textures are to be produced, application of the method in accordance with the present invention is often the only solution.

The advantages of the method are seen in improved optical, electrical or mechanical properties of the film. Despite the low thickness, they are similar to those of bulk material or comparatively thick films. A uniformly thick structure of the applied ultra-thin film is accompanied by a more uniform coverage and greater uniformity of the film properties in lateral extent as well as by an increased reproducibility of all film properties. The properties derived from the structure, such as the barrier effect, the electrical conductivity of metallic films or the dielectric parameters of non-conductive films, are much improved.

It may be beneficial to feed in the supply of discrete power pulses periodically over time. In this way generation of the power pulses is particularly simple in technical terms. It may also be beneficial to feed in the power pulses aperiodically. If the film growth is monitored by an in-situ measurement method, it is particularly advantageous to increase the intervals between the power pulses toward the end of the coating process. In this way the precision of the values obtained by the in-situ measurement method can be increased, and thus a closer conformance to the specified film thickness attained.

A beneficial method of depositing the ultra-thin film has been shown to be a supply of somewhere between 100 and 10,000 pulses, whereby the higher number of pulses increases precision in monitoring the film thickness, because there is less increase in thickness per single pulse. On the other hand, the technical commitment required to generate the power pulses is less if the number of pulses required for deposition of the overall ultra-thin film is kept low. For films with a thickness in the range from 1 to 10 nm, a pulse length of around 10 microseconds (μs) to 100 milliseconds (ms) has proven advantageous. The method in accordance with the invention is particularly simple if the pulses are fed in at a fixed but freely selectable power density and a fixed pulse duration as appropriate to the coating task, and the number of pulses required for deposition of the ultra-thin film is preset.

It may be beneficial for the power output to be essentially constant over time in each pulse—that is, for square pulses to be used. In terms of the commitment required for technical implementation of the method, as well as to attain specific advantages, it may however be beneficial for the power output to rise over time in each pulse, so that the power density at the end of each of the discrete power pulses reaches its maximum value. In this way, particularly high momentary values of the plasma density, and thus of the carrier current to the substrate, can be achieved at a given mean power density. In other applications, it may also be advantageous to feed in a high power at the beginning of the pulse which then falls over time in the course of the pulse.

The invention is illustrated in more detail by an embodiment of it illustrated in the Figures of drawings showing a magnetic film system produced using the method in accordance with the invention.

The present example illustrates the deposition of a thin film system on a glass substrate 1, as is required to manufacture magnetic disks. This includes a base film made of a nickel/aluminum alloy 2, on which there is a chromium film 3. On the chromium film 3 is a magnetic film 4'; 4" made of CoCrPtTa, which is divided by an ultra-thin film 5 made of CoCr into two subfilms. The thin film system is completed by a carbon top film 6. The magnetic disks are coated in a so-called single disk coater.

An exemplary coating facility of this kind can be composed of twelve process stations in which various single films can be applied. Only one magnetic disk is processed at a time on one process station. All processes are stationary, and all necessary processes are activated simultaneously. The processes should be completed within a maximum process time. When the maximum process time has elapsed, all the magnetic disks in the plant are conveyed simultaneously to the next process station. An exemplary cycle time can be six seconds, so that a maximum of four seconds is available for the coating process. In the sixth process station the ultra-thin film 5 is deposited from the cobalt/chromium alloy by magnetron atomization, and on it in the next process station the upper subfilm 4" of the actual magnetic film is applied. In this example, the thickness of the ultra-thin film 5 is set for precisely 1.05 nm. The stationary coating rate for the arrangement is 3 nm/s*kW. The specified film thickness of 1.05 nm was deposited at 97 W within 4 seconds. In accordance with the invention, however, the magnetron discharge is not run at 97 W, so there would be inadequate uniformity and reproducibility of the properties of the CoCr film 5. The optimum power output of the magnetron discharges for the magnetrons used in order to attain the desired film properties is 2.5 kW. This was verified on the basis of the structure and the properties of CoCr films in the thickness range from 30 to 50 nm. By a supply of 10,000 power pulses at a pulse-on time of 15 μs and a pulse-off time of 385 μs and a power output of 2.5 kW during the pulse-on time, firstly the magnetron discharge is run in the optimum range, resulting in the desired improvement in film properties, and secondly the mean coating rate is restricted by a factor of 26 relative to continuous running at 2.5 kW, which adjusts the coating time to the cycle time of the coater and permits precise conformance to the specified film thickness. In other words, in the present example, the power out of 2.5 kW is supplied during 10,000 pulse-on periods that are each 15 μs in duration, whereby the power output per second is an average of 16,667 kW/s (2.5 kW/(15 μs*10,000 pulses)) as compared to an average total power output per second of 0.625 kW/s (2.5 kW/((15 μs+385 μs)*10,000 pulses). The film thickness is set to exactly 1.05 nm by specifying the number of power pulses. The correlation between the film thickness and the number of pulses was ascertained previously by X-ray fluorescence measurements. The pulse-on time, pulse-off time and pulse power are kept constant in the present example.

A comparison of the measured properties of completely coated magnetic disks demonstrates the advantage of the method in accordance with the invention. In a reference test two otherwise identical film systems were produced, differing only in terms of the deposition conditions of the ultra-thin film 5. The specimen marked DC contains an ultra-thin film 5 which was deposited continuously within four seconds at a plasma power of 100 W. The second specimen was produced by the method in accordance with the invention.

| Method | Power in plasma | Film thickness | $H_c$ [Oe] | $H_c$ ramp[Oe] |
|---|---|---|---|---|
| DC | 100 W | 1.1 nm | 3000 | −150 |
| Invention | 2500 W | 1.05 nm | 3150 | +70 |

The leap in the coercive field strength from 3000 to 3150 Oe for an otherwise identical structure of the film system on the magnetic disk demonstrates the efficiency of the method in accordance with the invention. The deposition conditions have obviously been positively altered to such an extent that the upper subfilm 4" of the magnetic film can take on a more fine-crystalline structure. This means a higher storage density can be achieved.

The so-called $H_c$ ramp is a measure of the uniformity of the film properties over the entire active area of the magnetic disk. Previously, DC deposition methods from the inner to the outer in radial direction were marked by a drop in coercive field strength. This drop, termed a negative ramp, is particularly troublesome, because the circumferential speed at outer points in operation of the magnetic disk is higher than at inside points. No uniform storage density in radial direction can be attained. Using the method in accordance with the invention, this ramp was verifiably reduced by at least 50%, and it was even shown that a positive ramp—that is, a rise in coercive field strength from the inner to the outer—can be generated. By means of further optimization it is possible to improve the distribution of the storage density on the magnetic disk.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

We claim:

1. Process of producing a thin-film system containing at least one ultra-thin film, which is deposited by plasma chemical vapor deposition or plasma physical vapor deposition using magnetron discharges, comprising depositing the ultra-thin film by introducing power output into plasma of the plasma chemical vapor deposition or plasma physical vapor deposition in the form of a controlled number of power pulses, and the average power output per unit time during pulse-on time is higher by a factor of at least 3 as compared to a total power output over a total coating time during deposition of the ultra-thin film.

2. The process in accordance with claim 1 wherein the at least one ultra-thin film has a film thickness of from 1 to 10 nm.

3. The process in accordance with claim 2 wherein the power output is fed periodically into the plasma in a form of power pulses.

4. The process in accordance with claim 2 wherein the power output is fed aperiodically into the plasma in the form of power pulses.

5. The process in accordance with claim 2 comprising introducing 100 to 10,000 power pulses to obtain an entire deposition of the ultra-thin film.

6. The process in accordance with claim 1 wherein the average power output per unit time during pulse-on time is higher by a factor of at least 10 as compared to a total power output over a total coating time during deposition of the ultra-thin film.

7. The process in accordance with claim 6 comprising introducing 100 to 10,000 power pulses to obtain an entire deposition of the ultra-thin film.

8. The process in accordance with claim 1 wherein the power output is fed periodically into the plasma in a form of power pulses.

9. The process in accordance with claim 8 comprising introducing 100 to 10,000 power pulses to obtain an entire deposition of the ultra-thin film.

10. The process in accordance with claim 9 wherein at least one of power density and pulse duration of the power pulses is freely selectable.

11. The process in accordance with claim 10 wherein the power density and pulse duration of the power pulses during deposition of the ultra-thin film are kept constant.

12. The process in accordance with claim 11 wherein, during deposition of the ultra-thin film, the power pulses are counted, the film thickness is measured at least once after introduction of a specific number of power pulses, and a remaining number of power pulses required to attain the target film thickness is calculated therefrom and pre-set.

13. The process in accordance with claim 1 wherein the power output is fed aperiodically into the plasma in the form of power pulses.

14. The process in accordance with claim 1 comprising introducing 100 to 10,000 power pulses to obtain an entire deposition of the ultra-thin film.

15. The process in accordance with claim 1 wherein at least one of power density and pulse duration of the power pulses is freely selectable.

16. The process in accordance with claim 15 wherein the power density and pulse duration of the power pulses during deposition of the ultra-thin film are kept constant.

17. The process in accordance with claim 1 wherein power output in each pulse is essentially constant over time.

18. The process in accordance with claim 1 wherein power output in each pulse rises over time.

19. The process in accordance with claim 1 wherein power output in each pulse falls over time.

* * * * *